Oct. 15, 1968 C. A. NANNEY 3,406,299

NEGATIVE RESISTANCE DEVICE HAVING THERMAL INSTABILITY

Filed Oct. 27, 1965 2 Sheets-Sheet 1

INVENTOR
C. A. NANNEY
BY David P. Kelley
ATTORNEY 3,406,299

NEGATIVE RESISTANCE DEVICE HAVING THERMAL INSTABILITY

Cecil A. Nanney, Murray Hill, N.J., assignor to Bell Telephone Laboratories, Incorporated, New York, N.Y., a corporation of New York Filed Oct. 27, 1965, Ser. No. 505,370
5 Claims. (Cl. 307—306)

ABSTRACT OF THE DISCLOSURE

Certain materials, such as certain semimetals, exhibit a negative resistance and hysteresis loop in the I–V characteristic resulting from a thermal instability. A member of such material in contact with a superconductor member controls the state of the superconducting member in response to voltage pulses, with a switching time of the order of $10^{-13}$ seconds.

Figure 1:
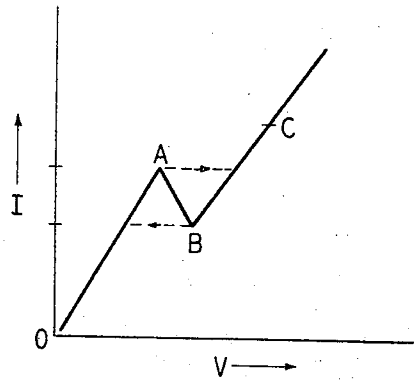

This invention relates to solid state high speed switching and high frequency generating devices, and, more particularly to such devices utilizing thermal instabilities in their constituent material or materials.

One of the most versatile and useful solid state devices used in high speed switching and high frequency generation is the tunnel diode, which enjoys wide use in, for example, the computer field. The tunnel diode, when operated in forward bias, exhibits a negative resistance characteristic at low voltages, e.g., one-half volt, and at low powers, e.g., one milliwatt. This characteristic, which produces a change in the conduction state of the diode in approximately $10^{-12}$ seconds, makes the diode quite useful in high speed switching applications, and also as a generator of high frequencies.

While the tunnel diode is a highly useful device, it does possess certain shortcomings. In computer applications especially, the voltages and powers required by the tunnel diode are somewhat high. In addition, there is a certain lack of flexibility in the tunnel diode inasmuch as it operates only in the forward bias direction. The tunnel diode requires the formation of a p-n junction with the attendant proper doping, thereby making precise reproduction of diode characteristics difficult. The presence of a junction introduces a capacitance and a certain amount of low frequency noise, both of which are undesirable in most applications.

The present invention is based upon the discovery of a negative resistance characteristic in certain materials which arises from a thermal instability in the material. Thus far the effect has been observed in certain semimetals, but it is quite possible that it may occur in various metals also.

Briefly, the effect may be described as follows. Under certain conditions of heating, the material reaches a thermal instability point where the temperature rapidly switches to a higher temperature. The increase in temperature produces an increase in resistance and a break in the current-voltage characteristic of the material. After the abrupt switch to a higher temperature, the material tends to stay in the higher temperature phase for a smaller current than the original "switch" current until a lesser switchback current is reached, at which point the temperature, and hence the current, switch back to the initial phase. Thus there is a hysteresis loop formed in the current-voltage characteristic, as is typical in negative resistance devices. Also, as in typical in such devices, the initial switching action appears to occur at a constant current but dynamic analysis reveals a decreasing current with increasing voltage section in the I–V characteristic. The decreasing current represents the negative resistance portion of the characteristic. In a first illustrative embodiment of the invention, a first member of material having a thermal conductivity characteristic which reaches a maximum at a temperature of, for example, 4° Kelvin, is in thermal and electrical contact over a very small area with a second member of material having a thermal conductivity maximum at, for example, 100° Kelvin. The unit is immersed in a suitable refrigerant. A voltage from a suitable source is applied across the interface between the two materials, producing a current through the juncture. As the current increases, the temperature rises until the point of thermal instability, 4° Kelvin, is reached in the first material, at which point the temperature jumps to approximately 100° Kelvin, the temperature of the thermal conductivity maximum of the second material. As a consequence, the resistance of the first material is increased by a factor of as much as 60. As the current is decreased after the temperature increases, the "snap back" occurs at a lower current than the original "snap over," thereby creating a current-voltage hysteresis loop. With such a pronounced loop, the device is useful in a variety of logic arrangements.

In a second illustrative embodiment of the invention, a member of material, such as antimony, having a thermal instability in its I–V characteristic is in contact with a member of superconducting material over a small area. The assembly is maintained at the superconducting temperature of the superconducting member. As a consequence, this member has a zero resistance. Means are provided for establishing a current through the junction between the two materials. When the current reaches the point of thermal instability, there is an abrupt increase in the temperature of the first member which produces an increase in temperature in the superconducting member, driving it into the normal conducting region, where it stays until the current is decreased sufficiently to produce a "snap back" in the temperature of the first member, at which time the second member becomes superconducting again. Such a device is useful as a memory element which may be sampled non-destructively.

In another illustrative embodiment of the invention, a single block of material having a thermal instability in its I–V characteristic, and which has a restricted area portion, is biased so that the block of material has currents in the region of the critical current flowing through it. The block is connected in a circuit with resistances such that the load line of operation of the material intersects the negative resistance portion of the I–V characteristic of the material. As a consequence, the material produces oscillations in the manner of any negative resistance device at frequencies of the order of $10^{12}$ cycles per second.

It is a principal feature of the present invention that a material having a temperature instability has applied thereto a voltage sufficient to produce currents in the region of the critical current, i.e., the current at which the instability occurs.

This and other features of the present invention will be readily apparent from the following detailed description and the accompanying drawings, in which:

FIG. 1 is a simplified diagram of the I–V characteristic of a material which exhibits thermal instability. The diagram shows that, as the current, and hence the temperature, is increased in such a material, a critical current (and temperature) A is reached at which point there is an extremely rapid increase in the temperature of the material without a corresponding increase in the current. The increase in temperature produces an increase in resistance in the material, hence a larger voltage is required to maintain the current at the value indicated at A. Where the volume of the material involved is small, the switch at point A to a higher temperature and voltage occurs in the order of $10^{-13}$ seconds or less. Despite this extremely short time constant, the current behaves as indicated by the solid line in FIG. 1 rather than as indicated by the dotted line. From the solid line it can be seen that there is a negative resistance region in the I–V characteristic that is exactly analogous to the current behavior in a tunnel diode. For most materials, the instability indicated in FIG. 1 occurs at cryogenic temperatures, although it is believed that certain materials may exhibit the instability at considerably higher temperatures.

After the occurrence of the thermal instability in the material, further increases in voltage produce approximately linear increases in current, as shown between A and C in FIG. 1. When the voltage and current are decreased from the point C, the thermal instability does not occur until the current value at B is reached, at which point there is an abrupt decrease in temperature and hence resistance in the material, and the characteristic switches from the line B–C to the line O–A. Because of the different values of current at which "switch over" and "switch back" occur, a hysteresis loop is formed, as indicated by the dotted lines in FIG. 1.

For a material such as antimony (Sb), the time constant involved in the negative resistance region is approximately $10^{-13}$ seconds as compared to $10^{-12}$ seconds for a tunnel diode. In addition, the phenomenon occurs at approximately $10^{-3}$ volts and one microwatt as compared to one-half volt and one milliwatt for the tunnel diode.

Figure 2A:
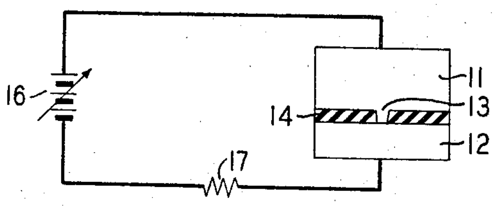
Figure 2B:
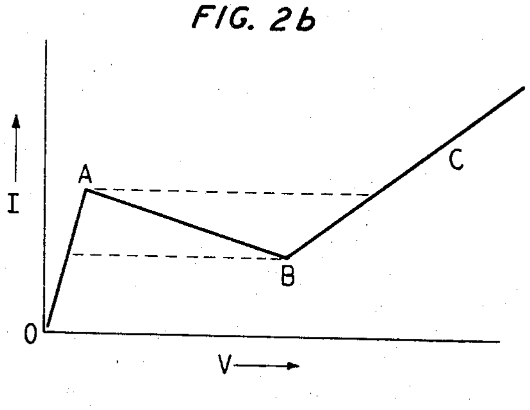

In FIGS. 2*a* and 2*b* there is shown an arrangement for producing a more pronounced hysteresis loop than that shown in FIG. 1, thereby making the device more usable in, for example, computer memory applications and amplifier applications. The device of FIG. 2*a* comprises a member 11 of a thermal instability material such as bismuth and a member 12 of a material such as beryllium. Member 11 contacts member 12 by means of a narrow protuberance 13 which typically, is of the order of $10^{-4}$ cm. thick. The remaining portions of members 11 and 12 are insulated from each other by suitable thermal and electrical insulating material 14. A variable voltage source 16 and load resistance 17 are connected in series with members 11 and 12. It is to be understood that source 16 and load 17 may take any of a number of forms, depending on the application of the device of FIG. 2*a*, and the forms shown here are for purposes of illustration only.

In operation current passes through member 11, protuberance 13 and member 12. As the voltage is increased, the temperature of the materials increases particularly in the protuberance region. Inasmuch as bismuth has a maximum thermal conductivity at approximately 4° Kelvin, while that of beryllium occurs at approximately 100° Kelvin, thermal instability for the arrangement of FIG. 2*a* occurs at approximately 4° Kelvin, at which instant the temperature at the point where protuberance 13 contacts member 12 jumps to approximately 100° Kelvin, thereby produces a 60 times increase in the resistance of the bismuth member. This can be seen in FIG. 2*b*, the thermal instability occurring at point A.

On the other hand, as the current and voltage are decreased from the point C, the characteristic does not change back to its original state until the point B is reached. As a consequence, the current-voltage characteristic for a pronounced hysteresis loop is thereby making the device useful in a variety of applications, such as, for example, a memory element and amplifier.

For the materials shown in FIG. 2*a*, suitable cooling means must be provided. Inasmuch as the cooling means may take any one of a number of forms, for simplicity no attempt has been made to depict a particular cooling arrangement.

Figure 3A:
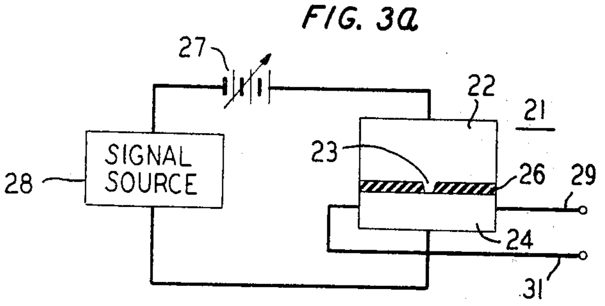

In FIG. 3*a* there is shown a device which functions as a high speed switch and memory element that may be sampled non-destructively.

The element 21 comprises a first member 22 of material having a thermal instability characteristic such as, for example, antimony. A protuberance 23 on member 22 is in contact with a strip 24 of superconducting material such as lead over a very small area. The remaining portions of members 22 and 24 are insulated from each other by suitable insulating material 26. Refrigeration means, not shown, maintains the element 21 at the superconducting temperature of the member 24. A source of variable bias 27 and a source 28 of switching singles are connected in series with the element 21, as shown. A pair of conductive leads 29, 31 are connected across the member 24 and lead to suitable circuitry for interrogating the element. This circuitry will vary according to the particular application, but in general it is some means for determining the conducting state of member 24.

Figure 3B:
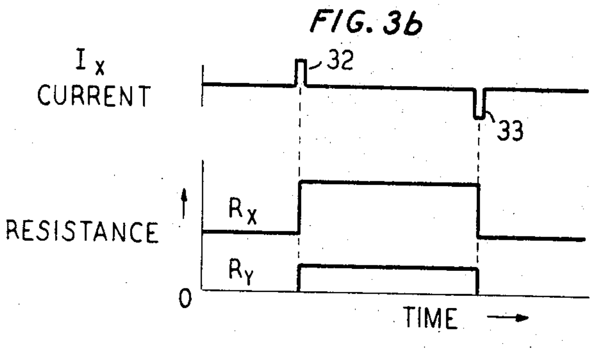

In operation, the source 27 supplies a current through the element that is just below the critical or thermal instability value for the member 22. At this value of current, the member 24 is in a superconducting state and the resistance between leads 29 and 31 is zero, thus an interrogation signal on leads 29, 31 would encounter zero resistance. When a positive going current pulse 32 is added on to the bias current, the total current exceeds the critical value and there is an abrupt temperature increase in member 22 which drives member 24 into its normal conducting state. The current through and resistance of element 21 are indicated by $I_x$ and $R_x$, respectively, in FIG. 3*b*, and the resistance of member 24 between leads 29, 31 is indicated by $R_y$. Termination of pulse 32 does not produce a switch back to superconductivity in member 24 because of the hysteresis loop in the characteristic of member 22. An interrogation signal on leads 29, 31 now encounters a finite resistance, indicating a change in state of member 24. Member 24 is returned to a superconducting state by a negative going pulse 33 from source 28, which switches member 22 back to its low temperature state, permitting member 24 to become superconducting again.

Figure 4A:
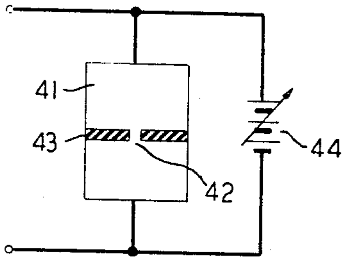

In FIG. 4*a* there is shown an arrangement wherein the thermal instability and negative resistance can be utilized to create a simple high frequency oscillator utilizing only bulk sample material. The arrangement of FIG. 4*a* comprises a member 41 of material, such as antimony, having a thermal instability characteristic. The member 41 has a constricted central portion 42 and the volume adjacent this portion is filled with suitable insulating material 43. A variable voltage source 44 is connected across member 41 producing a current sufficient to drive portion 42 into thermal instability, creating a negative resistance region in the current-voltage characteristic, as shown in FIG. 4*c*.

Figure 4B:
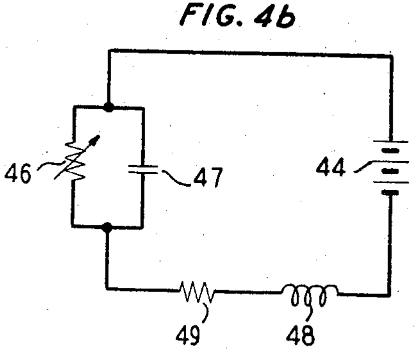
Figure 4C:
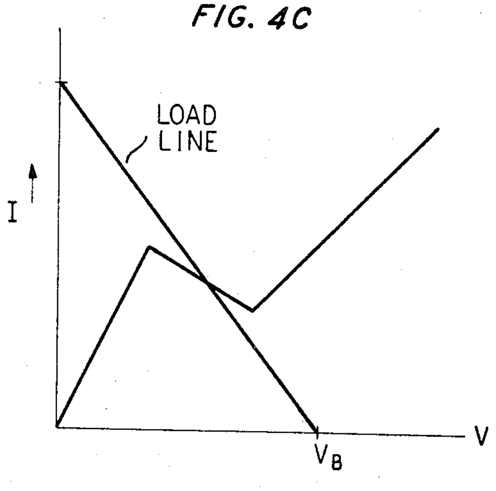

FIG. 4*b* is a diagram equivalent circuit of the arrangement of FIG. 4*a*. Resistance 46 is the resistance of the member 41, which varies with current. Capacitor 47 is a parasitic capacitance of the circuit, or it may be a deliberately added capacitance. In a like manner, inductance 48 is parasitic or lead inductance, a resistance 49 is the lead and load resistance. The conditions for oscillation are that resistance 49 be less than resistance 46 and that the bias voltage $V_B$ be adjusted so that the load line intersects the negative resistance portion of the I–V characteristic, as shown in FIG. 4*c*. Under such conditions the current in resistor 49 oscillates at a frequency determined by the electrical parameters and the thermal parameters, e.g., $10^{12}$ c.p.s.

It is to be understood that the circuit of FIG. 4*a* is merely illustrative of an oscillation circuit utilizing a negative resistance device of the present invention.

The foregoing embodiments are intended to illustrate the principles of the present invention. Numerous other arrangements utilizing these principles may occur to workers in the art without departing from the spirit and scope of the invention.

What is claimed is:

1. In combination, a member of material exhibiting a thermal instability in its current-voltage characteristic which occurs at a critical current, a portion of said member being in contact with a second member of superconducting material, means for maintaing the combination at the superconducting temperature of said second member, means for producing a current through said combination that is less than the critical current, and means for switching said second member from its superconducting state to its normal conduction state comprising means for increasing the current beyond the critical current.

2. The combination as claimed in claim 1 wherein said thermal instability material is of the group known as semimetals.

3. The combination as claimed in claim 1 wherein said thermal instability material is beryllium.

4. The combination as claimed in claim 1 wherein said thermal instability material is antimony.

5. The combination as claimed in claim 1 and further including means responsive to the change in states of said second member for furnishing an electrical indication of the state of said second member.

References Cited

UNITED STATES PATENTS

| | | | |
|---|---|---|---|
| 3,284,750 | 11/1966 | Komatsubara | 338—22 |
| 3,293,567 | 12/1966 | Komatsubara et al. | 331—107 |
| 3,303,427 | 2/1967 | Esaki | 307—88.5 XR |
| 3,325,703 | 6/1967 | Rutz | 317—234 |

ARTHUR GAUSS, *Primary Examiner.*

S. D. MILLER, *Assistant Examiner.*